United States Patent [19]

Inoue et al.

[11] Patent Number: 4,745,088
[45] Date of Patent: May 17, 1988

[54] VAPOR PHASE GROWTH ON SEMICONDUCTOR WAFERS

[75] Inventors: Yosuke Inoue, Ibaraki; Takaya Suzuki, Katsuta; Masahiro Okamura, Tokyo; Noboru Akiyama, Hitachi; Masato Fujita, Yamanashi; Hiroo Tochikubo, Tokyo; Shinya Iida, Tama, all of Japan

[73] Assignees: Hitachi, Ltd.; Kokusai Elect. Co. Ltd., both of Tokyo, Japan

[21] Appl. No.: 830,713

[22] Filed: Feb. 19, 1986

[30] Foreign Application Priority Data

Feb. 20, 1985 [JP] Japan .................. 60-30459

[51] Int. Cl.⁴ .................. C23C 13/08; C23C 16/00
[52] U.S. Cl. .................. 437/102; 437/173; 437/225; 437/235; 437/101; 148/DIG. 57; 148/DIG. 169; 156/611; 156/613; 427/51; 427/248.1; 118/724; 118/730
[58] Field of Search .......... 29/576 E; 148/1.5, 175, 148/DIG. 64, DIG. 65; 156/610–614; 357/60; 118/730, 725, 729; 427/51, 99, 86, 95, 248, 255

[56] References Cited

U.S. PATENT DOCUMENTS

| | | | |
|---|---|---|---|
| 3,224,912 | 12/1965 | Ruehr | 148/175 |
| 3,641,974 | 2/1972 | Yamada et al. | 118/48 |
| 4,062,318 | 12/1977 | Ban et al. | 118/49 |
| 4,098,223 | 7/1978 | Ertl et al. | 118/48 |
| 4,263,872 | 4/1981 | Ban | 118/721 |
| 4,339,645 | 7/1982 | Miller | 219/10.49 R |
| 4,401,689 | 8/1983 | Ban | 427/45.1 |
| 4,421,786 | 12/1983 | Mahajan et al. | 427/82 |
| 4,499,853 | 2/1985 | Miller | 118/725 |
| 4,574,093 | 3/1986 | Cox | 427/86 |
| 4,588,451 | 5/1986 | Vernon | 148/175 |

*Primary Examiner*—Brian E. Hearn
*Assistant Examiner*—William Bunch
*Attorney, Agent, or Firm*—Antonelli, Terry & Wands

[57] ABSTRACT

The vapor phase growth on semiconductor wafers is carried out by an apparatus in which a multiplicity of semiconductor wafers are held by a holder so that the semiconductor wafers lie one over another in a vertical direction, and are rotated together with the holder, the holder is placed in a heater disposed in a reaction vessel, a raw material gas supply nozzle and a raw material gas exhaust nozzle are provided within the heater so that the semiconductor wafers are interposed between the gas supply nozzle and the gas discharge nozzle, and the gas supply nozzle and the gas discharge nozzle have gas supply holes and gas discharge holes, respectively, so that a raw material gas can flow on each semiconductor wafer in horizontal directions. When the temperature of the heater is raised by a heating source to heat the semiconductor wafers, the raw material gas is supplied from the gas supply holes to each semiconductor wafer, and thus a uniform layer is grown on each semiconductor wafer from the raw material gas.

9 Claims, 5 Drawing Sheets

VAPOR PHASE GROWTH ON SEMICONDUCTOR WAFERS

BACKGROUND OF THE INVENTION

The present invention relates to a method of and an apparatus for growing a layer on a semiconductor wafer from vapor phase, and more particularly to a method of and an apparatus for growing a uniform layer on a multiplicity of semiconductor wafers each having a large diameter, from vapor phase.

In order to perform the vapor phase growth, as is well known, semiconductor wafers each acting as a substrate are placed in a reaction vessel, and a raw material gas is introduced into the reaction vessel while keeping the semiconductor wafers at an elevated temperature, to grow thin layers such as a thin monocrystalline silicon layer, a thin polycrystalline silicon layer, a thin silicon oxide layer and a thin silicon nitride layer, on the surface of each semiconductor wafer. The above vapor phase growth has been widely used for fabricating semiconductor devices such as a large scale integration circuit (LSI). An apparatus for vapor phase growth is required to satisfy the following conditions. (1) The thickness of thin layers grown on semiconductor wafers is uniform throughout the surface of each wafer, and among the wafers. (2) Crystal defects due to thermal stress or dusts are not introduced in semiconductor wafers themselves and in the grown layers. The vapor phase growth necessitates a complicated operation, requires a long processing time, and can treat only a small number of semiconductor wafers at a time. Accordingly, the vapor phase growth is comparatively high in process cost, as compared with other processes for growing a thin layer on semiconductor wafers. Thus, the apparatus for vapor phase growth is further required to satisfy the following conditions. (3) A large number of wafers can be treated at a time. (4) The apparatus has to be excellent in safety, since an inflammable, toxic gas is introduced into a high-temperature reaction vessel to form a thin layer on each wafer.

An apparatus for vapor phase epitaxy, that is, an apparatus for epitaxially growing a monocrystalline silicon layer on monocrystalline silicon wafers is strongly required to satisfy the above conditions (1) to (4), since the monocrystalline silicon layer is grown at elevated temperatures higher than 1,000° C., and the electrical characteristics of a semiconductor device using the grown silicon layer are determined dominantly by the quality of the grown layer. The apparatus for vapor phase epitaxy has been improved, that is, a horizontal type furnace has been replaced by a vertical type furnace, and the vertical type furnace has been replaced by a barrel type furnace. Thus, apparatuses for vapor phase epitaxy capable of satisfying the conditions (1) to (4) are now available on the market. In recent years, there is a tendency that a semiconductor wafer becomes large in diameter, in order to increase the number of pellets taken out of the wafer, thereby reducing the manufacturing cost of a semiconductor device. Accordingly, it has become impossible for conventional apparatuses for vapor phase epitaxy to satisfy the condition (1) fully. Further, in the conventional apparatuses, a plurality of wafers are placed in a furnace in the state that the wafers are arranged in the same plane. Accordingly, it is difficult for the conventional apparatuses to satisfy the condition (3). Further, in order to treat a large number of wafers at a time, it is necessary to make the conventional apparatuses large in scale. In order to make large the scale of the conventional apparatuses, problems with respect to heat and difficulties in making a large-sized, high-purity susceptor have to be solved.

In order to solve the problems of the conventional apparatus for vapor phase epitaxy provided with the vertical type furnace or barrel type furnace, it has been tried to use a hot-wall type apparatus for vapor phase growth (hereinafter referred to as "A-type apparatus") which is disclosed in a Japanese patent examined publication No. 52-11198, for epitaxially growing a semiconductor layer. In the A-type apparatus, a plurality of wafers are arranged in a horizontally placed cylindrical reaction vessel which is disposed in a cylindrical, resistance-heating furnace, so that the principal surface of each wafer is perpendicular to the longitudinal axis of the cylindrical reaction vessel, to increase the number of wafers which are treated at a time. However, this apparatus has the following drawbacks. That is, a raw material gas is introduced into the reaction vessel at one end thereof, and is exhausted from the reaction vessel at the other end thereof. Accordingly, a layer grown on a wafer which exists on the upstream side, is different in thickness from a layer grown on another wafer which exists on the downstream side. Further, the raw material gas flows through a space between adjacent wafers nonuniformly, and hence the thickness of a layer grown on a wafer is not uniform. In order to eliminate the above drawbacks, a layer has been grown on each wafer under reduced pressure. In a case where wafers each having a large diameter are used, however, it is still very difficult to make uniform the thicknesses of grown layers on a plurality of wafers from practical point of view.

The hot-wall type apparatus (that is, the A-type apparatus) has a further drawback that the wall of the reaction vessel is heated as can be seen from the term "hot-wall", and thus a layer is also grown on the wall of the reaction vessel from the raw material gas. When wafers are loaded into and unloaded from the reaction vessel, or the temperature of the wafers is raised and lowered, the layer deposited on the wall of the reaction vessel may peel off, and becomes dust, which causes defects in the grown layers. Therefore, it is necessary to remove the deposit on the reaction vessel, e.g. by utilizing the reverse reaction of growth. The reaction vessel, however, may be reacted with the deposit to disable the perfect removal. Also, it makes the total process time longer.

The A-type apparatus has another drawback that a resistance-heating furnace with large heat capacity is used, and hence it takes a long time to lower the temperature of the inside of the furnace. In order to solve the above drawback, wafers are loaded into and unloaded from the reaction vessel while keeping the reaction vessel at an elevated temperature. In such a method, however, when large wafers each having a diameter of more than 5 in. (namely, about 12.5 cm) are used, the temperature of a wafer is not uniform at the surface thereof, and thus lattice defects due to thermal stress may easily be generated. In order to solve this problem, the wafers are introduced into and taken out of the reaction vessel, after the temperature of the reaction vessel has been lowered to about 800° C. In this case, it takes several hours to lower the temperature of the reaction vessel, and hence the processing time is greatly increased.

The A-type apparatus has the drawback with respect to safety, that is, an additional drawback that the reaction vessel may be squashed. The wall of the reaction vessel is heated to a temperature higher than 1,000° C., the inside of the reaction vessel is kept at a reduced pressure, and the wall of the reaction vessel is corroded with a layer grown on the wall. Accordingly, there is a danger of the reaction vessel being squashed. Specifically, in a case where the diameter of the reaction vessel is made large to be able to include large wafers, the danger of being squashed is a very serious problem.

As has been explained in the above, it seems impossible that the A-type apparatus capable of treating a multiplicity of wafers satisfies the above-mentioned conditions (1) to (4) fully. Specifically, a hot-wall type apparatus for epitaxially growing a semiconductor layer from vapor phase has not yet been put to the practical use.

In order to eliminate the drawbacks of the A-type apparatus, another kind of apparatus for vapor phase growth (hereinafter referred to as "B-type apparatus") has been proposed in a Japanese patent application (unexamined publication No. 59-50093).

In the B-type apparatus, a heater is placed in a reaction vessel, to avoid squashing of the reaction vessel due to the heating thereof. Further, in this apparatus, gas inlets are provided in the vicinity of wafers so that a raw material gas flows among the wafers, thereby supplying the raw material gas to the principal surface of each wafer uniformly. However, the outlet for waste gas is provided at an end of the reaction vessel in a direction perpendicular to the principal surface of each wafer, and thus a state that the gas flow (in particular, the exhaust gas flow) are the same at all the wafers, is not achieved. Accordingly, the B-type apparatus cannot solve the problem that a layer grown on a wafer which exists on the upstream side, is different in thickness from a layer grown on another wafer which exists on the downstream side.

In order to improve the nonuniformity of the thickness of grown layer in the gas flow direction, a different kind of apparatus for vapor phase growth (hereinafter referred to as "C-type apparatus") has been proposed in a Japanese patent application (unexamined publication No. 59-59878). In this apparatus, a gas supply nozzle is disposed so that a raw material gas flows among wafers, as in the B-type apparatus, but the outlet for waste gas is provided in the direction of the diameter of wafers, to prevent waste gas having flowed along the wafer from reaching other wafers, thereby making the difference in thickness between a layer grown on the wafer and a layer grown on another wafer as small as possible. In this apparatus, however, the thickness of a layer grown on a wafer becomes nonuniform at the surface thereof, when the diameter of the wafer is large. In more detail, in a method of supplying a raw material gas from the small opening of a nozzle to large scale wafers and discharging waste gas on the side opposite to the nozzle, it is difficult to supply the raw material gas to the whole area of the surface of the wafer uniformly, and hence a layer is grown on the wafer only along the gas flow path. Further, the C-type apparatus has a drawback that the growth of a layer on a wafer is encouraged in the vicinity of the opening of the nozzle. This drawback is very serious in an epitaxial growth process in which the reaction temperature is high, and the supply of a raw material gas to wafers (gas phase mass transfer to the growing surface) is a rate-determining step.

It can be readily thought that in the B-type apparatus having a similar structure to the C-type apparatus, also, the thickness of a grown layer becomes nonuniform at the surface of each wafer, when the diameter of wafers is large.

As has been explained in the foregoing, an apparatus for vapor phase growth has not yet been developed which can grow a uniform semiconductor or other layer having a high crystalline quality, on each of a large number of wafers epitaxially and safely.

SUMMARY OF THE INVENTION

An object of the present invention is to provide a method of and an apparatus for safely growing a uniform layer having no lattice defects, on each of a multiplicity of semiconductor wafers with a large diameter, in a short time, by the vapor phase growth technique.

In order to attain the above object, according to one aspect of the present invention, a multiplicity of semiconductor wafers are held within a cylindrical heater capable of substantially surrounding all the semiconductor wafers, in a state that the semiconductor wafers are arranged in a vertical direction at substantially regular intervals while making the principal surface of each semiconductor wafer substantially parallel to a horizontal plane and are rotated about an axis passing through the substantial center of the principal surface of each semiconductor wafer, the heater is placed in a reaction vessel to isolate the heater from the external atmosphere (e.g. air), the heater is heated by a heating source provided outside of the reaction vessel, and a raw material gas is supplied from one side of the vicinity of the semiconductor wafers to each semiconductor wafer so that the flow of the raw material gas is substantially parallel to the principal surface of each semiconductor wafer, and is discharged on the other side opposite to the gas supply side, to grow a thin layer on each semiconductor wafer from the raw material gas.

Further, according to another aspect of the present invention, a fore chamber for cooling the semiconductor wafers is provided so that the fore chamber can be separated from the reaction vessel by an isolating wall capable of being opened and shut.

DESCRIPTION OF THE PREFERRED EMBODIMENTS

Figure 1:
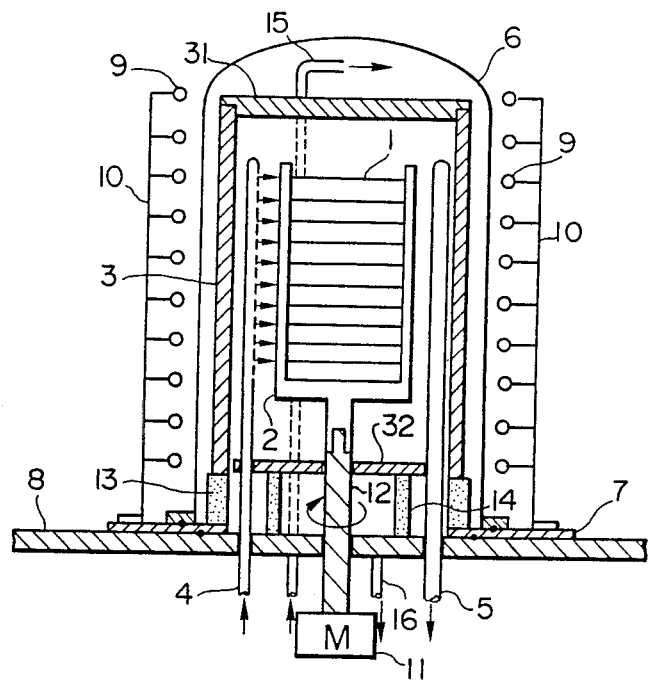
FIG. 1 is a sectional view showing an embodiment of an apparatus for vapor phase growth according to the present invention.
Figure 2A:
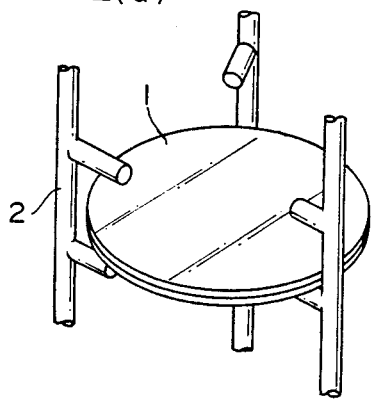
FIG. 2 is a sketch for explaining how wafers are supported in the embodiment of FIG. 1.
Figure 2B:
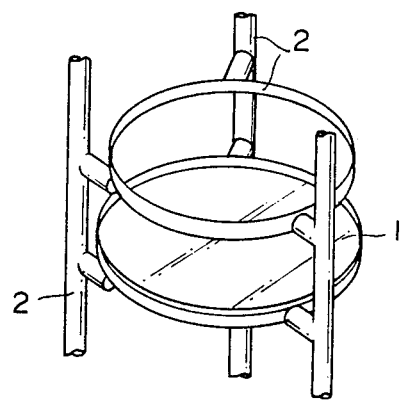

FIG. 1 shows an embodiment of an apparatus for vapor phase growth according to the present invention. Referring to FIG. 1, a large number of semiconductor wafers 1 are supported by a holder 2 so that the wafers are made parallel to a horizontal plane and arranged (stacked) in a vertical direction at substantially regular intervals. Accordingly, the wafers 1 can be rotatably supported by a simpler supporting mechanism, as compared with a case where the wafers are made parallel to a vertical plane. Further, the bottom of the holder 2 can be made small in area, and hence the vibration of the holder will be small when the holder is rotated. Thus, the generation of dusts will decrease. Further, those portions of the holder 2 where the wafers 1 are kept in contact with the holder 2, can be small in area. Accordingly, each wafer is scarcely applied with the thermal stress due to the difference in thermal expansion coefficient between the wafer and the holder, and thus there is little fear of lattice defects occurring in each wafer. In order to double the number of semiconductor wafers supported by the holder 2, a pair of semiconductor wafers may be placed at each stage of the holder 2 so that the wafers lie one upon the other and back to back with each other. FIG. 2 shows how the wafers 1 are supported by the holder 2. Part (a) of FIG. 2 shows a case where a pair of wafers are supported by the holder 2 at three points, and part (b) of FIG. 2 shows a case where each wafer is supported by a ring of the holder 2 along the periphery of the wafer. Referring back to FIG. 1, a heater 3 may have the shape of a cylinder, a box, or others, but is required to be able to substantially surround all the semiconductor wafers 1, thereby heating all of the semiconductor wafers 1 including the uppermost and lowermost semiconductor wafers, uniformly. In the present specification, the upper end of the cylindrical heater 3 is hermetically sealed with a disc-shaped heater (namely, an upper buffer) 31, and the lower end of the heater 3 is hermetically sealed with another disc-shaped heater (namely, a lower buffer) 32, except a few positions where the rotating shaft of the holder 2 and other members penetrate through the lower buffer 32. Thus, the whole heater has a cylindrical form. The heater 3 is made of high-purity carbon and coated with silicon carbide (SiC), in order to be free from contamination by a grown layer. A nozzle 4 for supplying a raw material gas of vapor growth reaction has many holes (or slits) for supplying the raw material gas to the semiconductor wafers 1 uniformly. An exhaust nozzle 5 has many holes (or slits) at positions corresponding to the holes (or slits) of the gas supply nozzle 4, for the following reasons. In a case where the raw material gas having achieved the above reaction is discharged only at one position, the gas flow on one of the wafers 1 may be different from that on another wafer, and thus a layer grown on the former wafer will be different in thickness and resistivity from a layer grown on the latter wafer. In the above case, when the flow rate of the raw material gas is increased, the raw material gas collides with that portion of the inner wall of the heater 3 which faces the gas supply nozzle 4, and makes a vortex motion. Accordingly, the growth rate of a layer formed on each wafer is very large in the vicinity of the above portion, and thus the thickness of the grown layer becomes nonuniform at the surface of each wafer. As mentioned above, each of the gas supply nozzle 4 and the exhaust nozzle 5 has many holes (or slits) so that the raw material gas flows on each wafer in a horizontal direction and waste gas having performed the vapor growth reaction can be discharged to the outside relatively rapidly. By forming such a gas flow, a useless layer is prevented from growing on the inner wall of the heater 3, and others. A reaction vessel 6 isolates the heater 3 and the wafers 1 from the external atmosphere (e.g. air), and forms a reaction chamber for vapor phase growth. A bell-jar made of quartz is usually used as the reaction vessel 6. A bell-jar base 7 supports the reaction vessel 6, and is placed on a furnace base 8. When the bell-jar base 7 is raised and lowered, the reaction vessel 6 and the heater 3 rise and fall. A heating source 9 for heating the heater 3 is provided outside of the reaction vessel 6. In the present embodiment, the heater 3 is heated by high-frequency heating, and hence the heating source 9 in FIG. 1 is expressed by a heating coil. Alternately, the heating source 9 may be an infrared lamp. Further, the whole heater may be heated in such a manner that infrared lamps are arranged so as to illuminate the top and bottom portions of the heater, and the side wall of the heater is heated by high-frequency induction. Furthermore, a current may be forced to flow through the heater 3, to heat the heater by resistance heating. It is to be noted that the heating source 9 is required to selectively heat only the heater 3, and to make the temperature rise at the reaction vessel 6 as small as possible. The heating source 9 is fixed to the bell-jar base 7 through a supporting member 10, and moves up and down when the base 7 is raised and lowered. It is needless to say that the heating source 9 may move up and down independently of the base 7.

The holder 2 is rotated by rotating means 11, such as a motor, through a shaft 12. The heater 3 is supported by a supporting member 13 which is made of a material with small thermal conductivity such as quartz. The supporting member 13 is placed on the bell-jar base 7 at the inner end thereof, to move the heater 3 vertically by raising and lowering the base 7. The lower heating disc (namely, the lower buffer) 32 is supported by a supporting member 14, which is made of quartz and placed on the furnace base 8. The exhaust nozzle 5 is connected to a pressure-reducing/evacuating system. A gas is introduced into a space between the heater 3 and the reaction vessel 6 by a gas supply nozzle 15, and is discharged through a gas outlet 16, to replace a gas in the above space by another gas.

Next, the epitaxial growth of silicon using the present embodiment will be explained, by way of example.

At first, the bell-jar base 7 is raised. Thus, not only the heating source 9 and the quartz reaction vessel 6 both fixed to the base 7 but also the heater 3 placed on the supporting member 13, is raised, and the quartz holder 2 is exposed. Then, for example fifty monocrystalline silicon wafers 1 each having a diameter of 5 in. (namely, about 12.5 cm) are loaded in the quartz holder 2 of 3-point supporting type in such a manner that a pair of silicon wafers lying one upon the other are placed on each of 25 stages which are provided at intervals of 5 mm. The holder 2 loaded with the silicon wafers is set so that the silicon wafers 1 are placed in the central portion of a reaction furnace which will be formed by lowering the base 7. The holder 2 is rotated by the rotating means 11 at a rotating speed of about 10 rpm. Since the rotating shaft 12 is parallel to the direction of gravity and the rotating speed is low, the silicon wafers 1 are rotated together with the holder 2. Accordingly, dusts are not generated, and there is no fear of breaking the peripheral portion of each silicon wafers. Next, the bell-jar base 7 is lowered, to enclose all the silicon wafers 1 with the heater 3 and to isolate the reaction chamber from the outside air by the bell-jar (that is, the reaction vessel) 6. The upper heating disc (namely, the upper buffer) 31 is mounted on the top of the heater 3, and the lower heating disc (namely, the lower buffer) 31 is set to the bottom of the heater 3 by the supporting member 14 on the furnace base 8, in such a manner that the rotating shaft 12 and others can pass through the lower heating disc 32. Accordingly, the silicon wafers 1 are substantially enclosed with the heater 3 and the heating discs 31 and 32.

Next, nitrogen gas is introduced into the furnace by the gas supply nozzle 4 at a flow rate of 50 l/min for 5 minutes, to replace the air within the furnace by nitrogen. Then, hydrogen gas is introduced at a flow rate of 50 l/min. After five minutes necessary for replacing the nitrogen gas within the furnace by the hydrogen gas has elapsed, high-frequency power is supplied to the heating coil 9, to heat the heater 3 to 1,100° C. The heater 3 is made of carbon and coated with silicon carbide (SiC), and hence the heater 3 itself can be heated to elevated temperatures by high-frequency induction. In this case, the quartz bell-jar 6 placed outside of the heater 3 is heated indirectly by the heater 3, but the temperature of the bell-jar 6 is hundreds of degrees lower than the temperature of the heater 3, for the reasons that the bell-jar 6 is not surrounded by the heater 3, that quartz transmits heat rays, and that the whole of the bell-jar 6 is cooled by a cooling fan (not shown). Accordingly, there is no danger of the bell-jar 6 squashing. The heater 3 made of carbon has a thickness of about 10 mm, and hence is smaller in heat capacity than a conventional electric furnace. Accordingly, the heater 3 can be heated to a predetermined temperature (namely, 1,100° C.) in a time as short as about 15 minutes. Further, the upper and lower heating discs 31 and 32 are also made of carbon, and can be heated by high-frequency induction. When the heater 3 and the heating discs 31 and 32 are heated to the predetermined temperature, these members 3, 31 and 32 make up a kind of integrating sphere, and thus the silicon wafers 1 are uniformly heated. Since the silicon wafers 1 and the holder 2 are encircled with the heater 3, the difference in temperature between the silicon wafers 1 and the holder 2 is very small. Accordingly, lattice defects due to thermal stress are not caused by the temperature rise for 15 minutes.

At the same time as the above heating is started, a rotary pump provided separately from the above-mentioned evacuating system is operated, to reduce the pressure within the furnace to about 200 Torr (namely, about 26,600 Pa). After the heater has been heated to the predetermined temperature, HCl gas is mixed into the hydrogen gas flow at a flow rate of 1 l/min for one minute, to perform dry etching for the surface of each silicon wafer, thereby cleaning the surface. Then, the supply of HCl gas is stopped, and purging is carried out by the hydrogen gas for two minutes. Then, dichlorosilane (SiH$_2$Cl$_2$) acting as a silicon source gas is mixed into the hydrogen flow at a flow rate of 2 l/min, to start the epitaxial growth of silicon. At this time, in order for a grown silicon layer to have a desired conductivity type and resistivity, a doping gas is added to the above mixed gas. (For example, in order to grow an n-type silicon layer having a resistivity of 10 Ωcm, phosphine (PH$_3$) is added to the mixed gas at a concentration of about 1 ppm). The raw material gas thus obtained is supplied from the small holes of the gas supply nozzle 4 uniformly to the surfaces of the silicon wafers 1 which are supported by the holder 2 in such a manner that each silicon wafer is made parallel to a horizontal plane and a pair of silicon wafers lying one upon the other are placed at each of 25 stages arranged in a vertical direction at regular intervals. The reduced pressure enhances the distribution of the raw material gas all over the wafer surface. The waste gas is discharged to the outside through the holes of the exhaust nozzle 5 which are provided at positions corresponding to the holes of the gas supply nozzle 4. Thus, substantially the same gas flow is given to the silicon wafers, and thus the difference in the thickness and resistivity of grown layer among the silicon wafers (i.e. wafer-to-wafer variance) can be made very small.

Meanwhile, the holder 2 and the silicon wafers 1 are rotated by the rotating shaft 12. Accordingly, the thickness and resistivity of the grown layer are uniform at each silicon wafer, though the raw material gas flows only in one direction. Further, the temperature of the bell-jar 6 is low, and hence a silicon layer is not deposited on the inner wall of the bell-jar 6. Accordingly, dusts are not generated from the bell-jar 6.

After the epitaxial growth has been made for 10 minutes to obtain a silicon layer having a thickness of about 5 μm, the supply of the silicon source gas is stopped, and the inside of the furnace is purged by the hydrogen gas for two minutes. Then, the cooling is started.

The high-frequency power supplied to the heating coil 9 is gradually decreased for about 20 minutes, and then the supply of the high-frequency power is stopped. Further, the rotary pump is stopped to increase the pressure within the bell-jar 6 to the atmospheric pressure. After the inside of the furnace has been cooled by the hydrogen gas for 10 minutes, the supply of the hydrogen gas is stopped and nitrogen gas is introduced into the furnace at a rate of 50 l/min for 5 minutes to replace the hydrogen within the furnace by nitrogen. In the above cooling time, the heater 3 and the silicon wafers 1 are cooled to a temperature (for example, 300° C.) which is lower than temperatures at which the surface of each silicon wafer can be oxidized when exposed to air. This cooling time is far shorter than (that is, about one-fifth of) the cooling time in a conventional hot-wall type apparatus for vapor phase growth, since the heater 3 is small in heat capacity. Thereafter, the bell-jar base 7 is raised, and the silicon wafers 1 are taken out. Thus, one growth process (that is, the first growth process) is completed.

Prior to the second growth process, the holder 2 is replaced by a cleaned one, since silicon has been deposited on the holder 2. It is to be noted that when the amount of silicon deposited on the holder 2 increases, the deposited silicon may peel off in the heating/cooling time and thus dusts may be generated. Further, quartz members having been contaminated with silicon such as the gas supply nozzle 4 and the exhaust nozzle 5 are replaced by new members. However, it is unnecessary to replace the heater 3 and the upper and lower heating discs 31 and 32 by new ones, since the difference in thermal expansion coefficient between silicon and the above members 3, 31 and 32 (SiC-coated carbon) is smaller than the difference in thermal expansion coefficient between silicon and quartz. After about 50 growth processes have been carried out, that is, the total thickness of grown silicon layer has reached about 250 μm, dry etching is carried out without loading silicon wafers into the holder 2, to remove silicon from the heater 3 and the heating discs 31 and 32.

Figure 3:
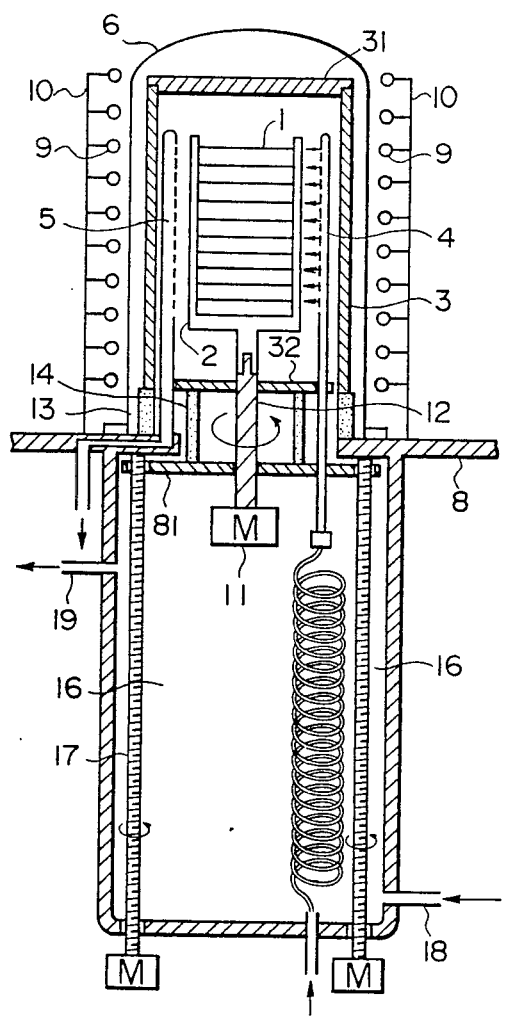
FIG. 3 is a sectional view showing another embodiment of an apparatus for vapor phase growth according to the present invention.

FIG. 3 shows another embodiment of an apparatus for vapor phase growth according to the present invention. In this embodiment, a furnace for vapor phase growth is provided with a fore chamber for cooling wafers, not only to shorten a time necessary for heating or cooling the wafers but also to eliminate a purging period using nitrogen, thereby increasing the throughput and making it possible to treat wafers having a large diameter. In FIG. 3, the same reference numerals as in FIG. 1 designate identical or equivalent parts. Further, in FIG. 3, reference numeral 16 designates a fore chamber for cooling wafers, and 81 a movable base (that is, an isolating plate).

Referring to FIG. 3, wafers 1, on which a layer has been grown, are cooled within the heater 3 for 10 minutes so that the temperature of the wafers 1 and heater 3 is reduced to about 800° C. Then, the movable base 81 is lowered, for example, by operating rotating shafts 17, while maintaining the heater 3 at the above temperature, to transfer the wafers 1, the holder 2, the gas supply nozzle 4 and the lower buffer 32 into the fore chamber 16. Thus, the wafers 1 are placed outside of the heater, and are rapidly cooled. Then, by an automatic manipulator (not shown), the wafers 1 are taken out of the fore chamber 16, and new wafers are loaded into the holder 2. Further, the gas supply nozzle 4 is replaced by new one. In this case, the same gas as in the bell-jar 6, that is, hydrogen gas is introduced from a purging gas inlet 18 into the fore chamber 16, and is discharged through the gas outlet 19. Accordingly, a purging process using nitrogen can be omitted, and thus the processing time can be shortened. Then, the movable base 81 is raised, to place the wafers 1 and the holder 2 in the heater 3 which is kept at 800° C. The high-frequency power supplied to the heating coil 10 is increased so that the heater 3 is heated to the predetermined temperature (namely, 1,100° C.) when 10 minutes have elapsed. Generally speaking, the probability that lattice defects are generated in a crystal by thermal stress, increases as the temperature of the crystal is higher. Accordingly, when the wafers are rapidly inserted into the heater 3 which is kept at a relatively low temperature (namely, 800° C.), and is then heated to the predetermined temperature (namely, 1,100° C.), that is, when a ramping operation is performed, the loading and unloading of wafers which are apt to bring about the nonuniform heating of wafer, are made at the relatively low temperature. As a result, no defects are generated even in a large wafer having a diameter greater than 5 in. (namely, about 12.5 cm), and moreover a time necessary for heating or cooling the wafers can be made shorter than that in the conventional apparatus. Specifically, the cooling time is far shorter than that in the conventional apparatus. In more detail, even if the ramping operation is performed in the conventional apparatus, one or two hours will be necessary to reduce the temperature of the furnace from 1,000° C. to 800° C., since the furnace of the conventional apparatus is provided with a quantity of heat insulator and thus has a large heat capacity. The heater 3 according to the present invention is far smaller in heat capacity than the conventional furnace, and hence the cooling time can be made about one-fourth of the cooling time in the conventional apparatus.

According to the present embodiment which is provided with the fore chamber for cooling wafers, a uniform layer can be epitaxially grown on each of large wafers having a diameter greater than 5 in. (namely, about 12.5 cm) without including any defects, and moreover the throughput can be increased.

Figure 4:
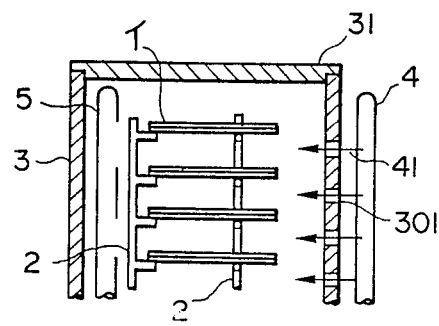
FIG. 4 is an enlarged sectional view showing the positional relation between a gas supply nozzle and a heater, in a further embodiment of an apparatus for vapor phase growth according to the present invention.

FIG. 4 shows a main part of a further embodiment of an apparatus for vapor phase growth according to the present invention. In the present embodiment, the gas supply nozzle 4 made of quartz is placed outside of the heater 3, in order for the nozzle 4 to diminish in frequency of renewal exchange. In this case, in order to supply the raw material gas uniformly to the wafers 1 through the heater 3, the heater 3 has holes (or slits) 301 at positions corresponding to the holes (or slits) 41 of the nozzle 4. According to the present embodiment, the temperature rise at the nozzle 4 is suppressed, and the amount of silicon deposited on the nozzle 4 is decreased. Accordingly, the nozzle 4 diminishes in frequency of renewal. Incidentally, when the exhaust nozzle 5 is made of carbon and coated with SiC in the same manner as the heater 3, the renewal of the exhaust nozzle 5 can be unnecessary.

In the embodiment of FIG. 1 for carrying out the vapor phase growth within the heater under reduced pressure, the inside of the heater is heated to elevated temperatures, and the nozzle 4 disposed in the vicinity of the wafers 1 is heated to more than 1,000° C. Accordingly, silicon may be deposited on the nozzle 4, and thus the holes (or slits) of the nozzle 4 are clogged or the amount of gas supplied from the nozzle 4 is decreased. That is, it is impossible to maintain the supply of raw material gas to each wafer constant.

Figure 5:
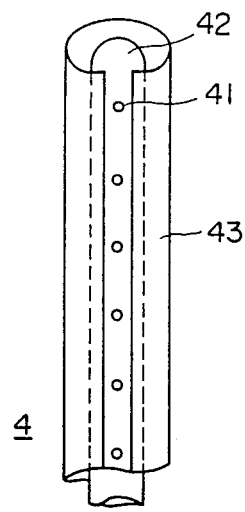
FIG. 5 is a perspective view showing an example of a gas supply nozzle used in an apparatus for vapor phase growth according to the present invention.

FIG. 5 shows a gas supply nozzle which can prevent the deposition of silicon on the holes of the nozzle. Referring to FIG. 5, the gas supply nozzle 4 has a double-tube structure that an outer tube 43 is disposed around an inner tube 42 having the holes 41. The outer tube 43 prevents the thermal radiation of the heater 3 from raising the temperature of the inner tube 42. When the nozzle 4 does not have a multi-tube structure, the difference in temperature between the nozzle 4 and the wafers 1 is small, and silicon is deposited on the nozzle 4. When HCl gas is added to the raw material gas to prevent the deposition of silicon on the nozzle 4, there is a fear of the HCl gas etching the wafers 1.

The outer tube 43 for shielding the inner tube 42 from the thermal radiation may be made of opaque quartz, or may be made of carbon and coated with SiC.

Figure 6:
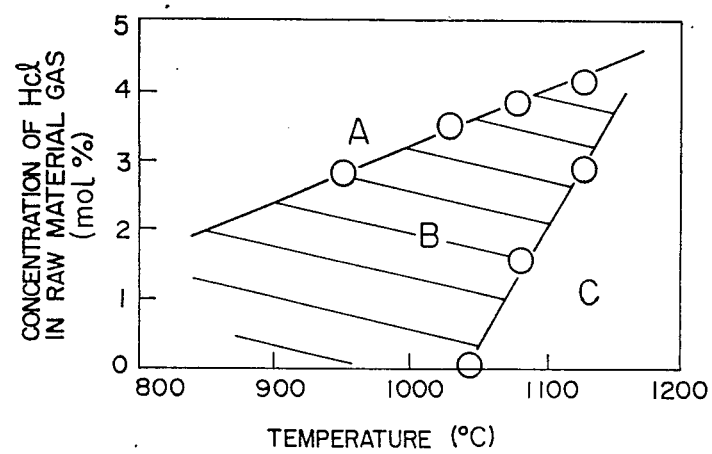
FIG. 6 is a graph showing an effective concentration range of HCl in a case where HCl gas is added to a raw material gas to prevent a silicon layer from growing on a gas supply nozzle.

As mentioned above, in order to prevent the deposition of silicon on the nozzle 4, hydrogen halide gas, for example, HCl gas may be added to the raw material gas when a silicon layer is epitaxially grown on each wafer. In this case, HCl gas is added to the raw material gas, for example, at a concentration within a hatched area of FIG. 6. FIG. 6 shows a relationship among the temperature for growing a silicon layer, the mol concentration of HCl in the raw material gas, and the deposition of silicon, in a case where a quartz wafer and a silicon wafer are used as the substrate and HCl gas is added to the raw material gas which contains $SiCl_4$ at a predetermined concentration. Three regions A, B and C are shown in FIG. 6. In the region A, silicon is not deposited on either of the quartz wafer and the silicon wafer. In the region B, silicon is deposited on the silicon wafer, but is not deposited on the quartz wafer. In the region C, silicon is deposited on both the silicon wafer and the quartz wafer. That is, silicon can be deposited only on the silicon wafer by adding HCl gas to the raw material gas. As can be seen from FIG. 6, when HCl gas is added to the raw material gas at a concentration of 3 mol %, silicon can be epitaxially grown on silicon wafers at 1,100° C. without depositing silicon on the quartz nozzle, even if the quartz nozzle is not cooled. In this case, however, the growth rate of the epitaxial layer is reduced to one-third of the ordinary growth rate due to the addition of HCl gas to the raw material gas, and is considered to be unpractical. Further, in this case, the selective growth region B of FIG. 6 is limited to a narrow range, and thus is considered to be unstable. However, it will be readily known from FIG. 6 that when the concentration of HCl in the raw material gas is reduced to 1 mol % and only the quartz nozzle is cooled to about 1,000° C., for example, by a cooling gas, a silicon layer can be epitaxially grown on the silicon wafers at a practical growth rate, and at the same time the deposition of silicon on the quartz nozzle can be prevented.

The inventors' experiment showed that a thin silicon film was epitaxially grown on silicon wafers at a growth rate of about 0.5 $\mu$m/min when the raw material gas containing about 2% HCl and about 1% $SiCl_4$. In the above experiment, the gas supply nozzle 4 was made of quartz and had a double-tube structure that the outer tube 43 shielded the inner tube 42 from thermal radiation. Accordingly, silicon was not deposited on the inner tube 42, and the holes of the inner tube 42 were not clogged.

In a gas supply nozzle having a double-tube structure, it is possible to interpose cooling means (for example, a cooling gas) between the inner and outer tubes in such a manner that the supply of raw material gas from the holes of the nozzle to wafers is not prevented by the cooling means.

Figure 7:
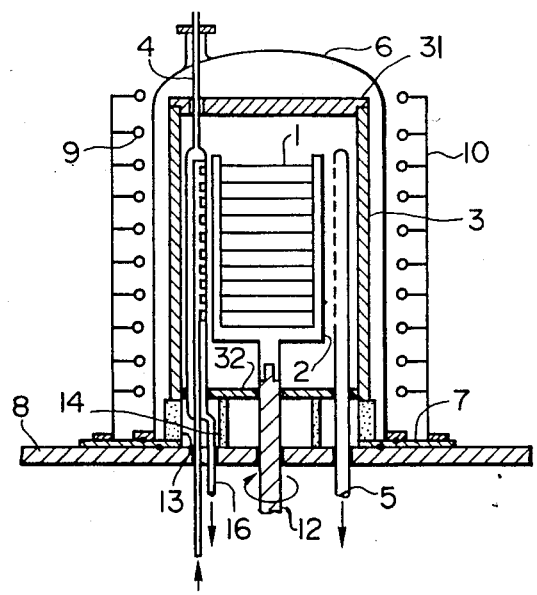
FIG. 7 is a sectional view showing still another embodiment of an apparatus for vapor phase growth according to the present invention.
Figure 8:
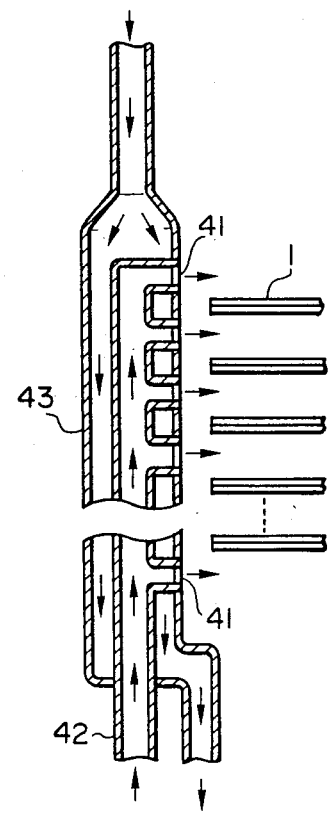
FIG. 8 is an enlarged sectional view showing the gas supply nozzle of FIG. 7 in more detail.

FIG. 7 shows still another embodiment of an apparatus for vapor phase growth according to the present invention. In this embodiment, the gas supply nozzle has a double-tube structure that a cooling gas flows between the inner and outer tubes of the nozzle. FIG. 8 shows the enlarged section of the above gas supply nozzle. In FIGS. 7 and 8, the same reference numerals as in FIG. 1 designate identical or equivalent parts. The embodiment of FIG. 7 is different from the embodiment of FIG. 1 in the structure of the gas supply nozzle 4. In the present embodiment, that portion of the gas supply nozzle 4 which exists inside the heater 3, has a double-tube structure, and the raw material gas and the cooling gas flow through the inner tube 42 and the outer tube 43, respectively. Small holes 41 are provided at those positions of the nozzle 4 which correspond to the wafers 1, and the raw material gas containing a source material at a constant concentration is supplied from the small holes 41 to the wafers 1 uniformly. At this time, according to the present invention, the raw material gas flows through the inner tube 42 in a direction opposite to a direction in which the cooling gas flows through the outer tube 43, and thus that portion of the nozzle 4 which exists in the vicinity of the wafers 1, is uniformly cooled.

Next, explanation will be made of the epitaxial growth of silicon using the present embodiment.

At first, the base 7 is raised to raise the heater 3, the nozzle 4 and the reaction vessel 6. The nozzle 4 passes through the base 7 slidably while keeping a hermetically sealed state. When the base 7 is raised, the reaction vessel 6 is put to an open state, and 50 monocrystalline silicon wafers 1 each having a diameter of 4 in. (namely, about 10 cm) are loaded into the holder 2 in such a manner that a pair of silicon wafers laid one upon the other and back to back with each other are placed at each of 25 stages which are provided in a vertical direction at intervals of 1 cm. Then, the base 7 is lowered, and thus the wafers 1 are set in a central portion of the reaction chamber formed of the bell-jar 6. Next, nitrogen gas is introduced from twenty-six holes 41 of the inner tube 42 which are provided so that each wafer pair exists between adjacent holes 41 when viewed from the nozzle 4, into the reaction vessel 6 for five minutes while discharging the air within the reaction vessel 6 through the gas outlet 16. Then, the supply of nitrogen gas is stopped, and high-frequency power is supplied to the heating coil 9 while introducing a hydrogen gas which will be used as a carrier gas for a silicon source material, from the inner tube 42 into the reaction vessel 6 at a flow rate of 30 l/min, to heat the wafers 1 to 1,100° C. At this time, another hydrogen gas acting as the cooling gas is caused to flow through the outer tube 43 at a flow rate of 50 l/min in a direction opposite to the direction of the gas flow in the inner tube 42, to cool the wall of the nozzle 4. When the wafers 1 are heated to 1,100° C., a silicon source material, for example, silicon tetrachloride ($SiCl_4$) is added to the carrier gas at a concentration of 1 mol %, to start the epitaxial growth of silicon. The raw material gas thus obtained flows through the inner tube 42 in a direction opposite to the direction of the flow of the cooling gas in the outer tube 43, and thus the decrease in the cooling effect of the cooling gas on the nozzle 4 due to the passage of the cooling gas through a high-temperature region and the decrease in the cooling effect of the raw material gas on the nozzle due to the passage of the raw material gas through the high-temperature region cancel each other, and thus the wall of the nozzle 4 is uniformly cooled. Accordingly, the deposition of silicon on the inner tube 42 can be prevented. Further, the raw material gas is ejected from all the holes 41 at substantially the same temperature, and thus all the wafers 1 are kept at the same temperature. Furthermore, the raw material gas kept at a constant temperature and containing the silicon source material at a constant concentration is supplied from each hole 41 to the center of each wafer 1 uniformly.

In the above explanation, hydrogen gas has been used as the cooling gas. Inert gases such as He and Ar, or nitrogen ($N_2$) gas may be used as the cooling gas.

In the above-mentioned epitaxial growth of silicon using the embodiment of FIG. 7, the reaction gas (namely, the raw material gas) flowing through the inner tube 42 does not contain HCl gas. However, if a small amount of HCl gas is added to the reaction gas in accordance with the growth temperature and the kind of the silicon source material, that is, at a concentration such as suggested by FIG. 6, the deposition of silicon on the inner tube 42 will be more prevented.

In order to prevent silicon deposition at the whole of that portion of the inner tube 42 which exists inside the heater 3, in a case where a silicon layer is grown selectively on the wafers 1 by adding hydrogen halide gas such as HCl gas to the raw material gas, it is necessary to cool the above portion uniformly. According to the nozzle structure shown in FIG. 8, that portion of the nozzle 4 which exists in the heater 3, can be uniformly cooled. Accordingly, by adding a small amount of HCl gas to the raw material gas, the deposition of silicon on the nozzle 4 is prevented at the whole of that portion of the nozzle 4 which exists in the heater 3, and moreover a uniform silicon layer can be epitaxially grown on the silicon wafers 1.

The double-tube nozzle 4 used in the embodiment of FIG. 7 has a large number of holes. However, the nozzle 4 may have slits in place of the holes. Further, in the embodiment of FIG. 7, the growth of a layer on the wafers 1 may be made under reduced pressure or atmospheric pressure. In FIG. 7, the cooling gas is discharged into the reaction vessel 6. In this case, the raw material gas in the reaction vessel is diluted by the cooling gas. Accordingly, it is preferred to discharge the cooling gas to the outside of the reaction vessel.

Figure 9:
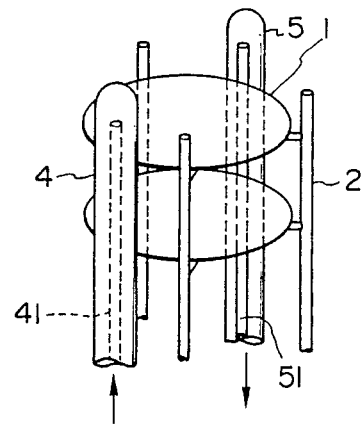
FIG. 9 is a perspective view showing modified versions of a gas supply nozzle and a gas discharge nozzle used in an apparatus for vapor phase growth according to the present invention.

FIG. 9 shows modified versions of the gas supply nozzle 4 and the exhaust nozzle 5. In the modified nozzles, a slit 41 and a slit 42 are used as the gas inlet and the gas outlet, respectively. The raw material gas can flow on the wafers 1 in horizontal directions, even when the nozzles 4 and 5 of FIG. 9 are used.

Figure 10:
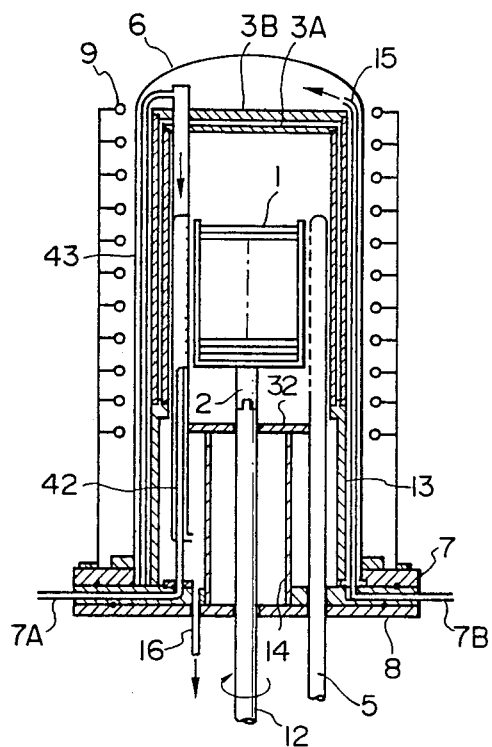
FIG. 10 is a sectional view showing a still further embodiment of an apparatus for vapor phase growth according to the present invention.

FIG. 10 shows a still further embodiment of an apparatus for vapor phase growth according to the present invention. In FIG. 10, the same reference numerals as in FIGS. 1 and 7 designate identical or equivalent parts. The present embodiment is different from the embodiment of FIG. 7 in the structure of heater and the sealing structure. Further, the structure of heater and the sealing structure shown in FIG. 10 are applicable to the embodiment of FIG. 1. In the present embodiment, a heater has a double structure. That is, the heater includes an inner cylinder 3A and an outer cylinder 3B which are made of carbon and quartz, respectively. These cylinders 3A and 3B are supported by the common supporting member 13. The outer tube 43 of the nozzle 4 is extended from the base 7 to an upper portion of the quartz vessel (that is, the reaction vessel) 6 through a space between the quartz vessel 6 and the outer cylinder 3B, and then penetrates the inner and outer cylinders 3A and 3B, to be led to the inside of the inner cylinder 3A. The inner tube 42 of the nozzle 4 and the base 7 are butted together. The inner tube 42 and outer tube 43 of the nozzle 4 are connected to communicating holes provided in the base 7, and the raw material gas and the cooling gas are supplied to the inner tube 42 and the outer tube 43, respectively, through the communicating holes. It is to be noted that only a communicating hole 7A connected to the inner tube 42 is shown in FIG. 10. The gas supply nozzle 15 for replacing a gas existing in a space between the outer cylinder 3B and the quartz vessel 6, is connected to a communicating hole 7B which is provided in the base 7. Accordingly, in a process in which the base 7 is raised and then lowered, even if the quartz vessel 6, the nozzle 4 and the supporting member 13 are detached from and then attached to the base 7, hermetical sealing will be ensured, and the supply and discharge of gas will be carried out with no difficulty.

In order to clearly show the effect of the present invention, explanation will be made of a case where an n-type silicon layer having a thickness of about 5 $\mu$m and a resistivity of about 10 $\Omega$cm was epitaxially grown on 50 silicon wafers each having a diameter of 5 in. (namely, about 12.5 cm) by using the embodiment of FIG. 1. In the above case, the reaction vessel 1 had an inner diameter of about 290 mm, the heater 3 had an inner diameter of about 250 mm, the distance between the gas ejecting holes of the gas supply nozzle 4 and the wafers 1 was about 20 mm, the nozzle 4 had an outer diameter of about 9 mm, and the exhaust nozzle 5 had an outer diameter of about 18 mm. A variation of $\pm 3\%$ in thickness of the grown layer was observed at each silicon wafer, and there was $\pm 5\%$ difference in thickness of the grown layer among the silicon wafers. Further, a variation of $\pm 5\%$ in resistivity of the grown layer was observed at each silicon wafer, and there was $\pm 5\%$ difference in resistivity of the grown layer among the silicon wafers. The above variations and differences were about one-half of the variations and differences in thickness and resistivity of silicon layers obtained by a conventional apparatus. Further, the dislocation due to thermal stress (namely, the slip defects) and the projection-shaped defects were not found in the grown layer. A time needed from the loading of the silicon wafers till the unloading thereof was about 56 minutes, and the processing time was about one-half of the processing time in the conventional apparatus. The temperature of the quartz vessel (that is, the reaction vessel) 6 was about 500° C. when the silicon layer was epitaxially grown. Therefore, silicon was scarcely deposited on the quartz vessel 6, and there was no fear of the vessel 6 being squashed.

In the above, the epitaxial growth of silicon according to the present invention has been explained, by way of example. However, it is needless to say that the present invention is also applicable to the formation of a thin film such as a thin polycrystalline silicon film or an insulator film by chemical vapor deposition.

According to the present invention, the thicknesses of the epitaxial layers on all the wafers within a heater are made uniform. When uniformity of the thickness distribution in one wafer is further desired, it is preferable to reduce the gas pressure within the heater to a reduced pressure of 200 to 300 torr or less so as to cause rapid spreading of the raw material gas as soon as the gas is supplied from the supply nozzle, and to provide a plurality of supply nozzles and a corresponding number of exhaust nozzles.

We claim:

1. A method of growing a thin layer on a semiconductor wafer from vapor phase, comprising the steps of:
    holding a multiplicity of semiconductor wafers within a cylindrical heater in a state that said semiconductor wafers are arranged in a vertical direction at substantially regular intervals while making the principal surface of each semiconductor wafer substantially parallel to a horizontal plane and are rotated about an axis passing through the substantial center of the principal surface of each semiconductor wafer, said heater being able to substantially surround all the semiconductor wafers;
    placing said heater in a reaction vessel to isolate said heater from the external atmosphere;
    heating said heater by a heating source, said heating source being provided outside of said reaction vessel; and supplying a raw material gas from one side of said semiconductor wafers to each semiconductor wafer, at a position in the vicinity of each said semiconductor wafer, so that the flow of said raw material gas is substantially parallel to the principal surface of each semiconductor wafer, the raw material gas being supplied by a gas supply nozzle, the gas supply nozzle being placed outside of the heater, and discharging exhausted raw material gas on the other side opposite to the gas supply side, at a position in the vicinity of each said semiconductor wafer, to grow thin layers on said semiconductor wafers from said raw material.

2. A method according to claim 1, wherein said raw material gas is supplied from a plurality of gas supply holes to said semiconductor wafers and is discharged through a plurality of exhaust holes which are provided at positions corresponding to said gas supply holes, so that said raw material gas flows on the principal surface of each semiconductor wafer in directions parallel to said principal surface 3. A method of growing a layer on a semiconductor wafer from vapor phase, comprising the steps of:
placing a multiplicity of semiconductor wafers within a reaction vessel;
heating all the semiconductor wafers to an elevated temperature; and
supplying a raw material gas from the inner tube of a double-tube nozzle to said semiconductor wafers in a state that a gas flows through the outer tube of said double-tube nozzle in a direction opposite to a direction in which said raw material gas flows through said inner tube, to grow a layer on said semiconductor wafers, said inner tube having a multiplicity of holes or slits for supplying said raw material gas to said semiconductor wafers.

4. A method according to claim 2, wherein said supply holes are provided at a side of the semiconductor wafers opposed to the respective positions of the exhaust holes, the supply holes and exhaust holes respectively providing raw material gas and removing exhausted raw material gas across the spaces between pairs of adjacent wafers.

5. A method according to claim 1, wherein the heater has holes in the side thereof, the holes in the side of the heater being the respective positions from which the raw material gas is supplied to respective semiconductor wafers.

6. A method of growing a thin layer on a semiconductor wafer from vapor phase, comprising the steps of:
holding a multiplicity of semiconductor wafers within a cylindrical heater in a state that said semiconductor wafers are arranged in a vertical direction at substantially regular intervals while making the principal surface of each semiconductor wafer substantially parallel to a horizontal plane and are rotated about an axis passing through the substantial center of the principal surface of each semiconductor wafer, said heater being able to substantially surround all the semiconductor wafers;
placing said heater in a reaction vessel to isolate said heater from the external atmosphere;
heating said heater by a heating source, said heating source being provided outside of said reaction vessel; and
supplying a raw material gas from one side of said semiconductor wafers to each semiconductor wafer, at a position in the vicinity of each said semiconductor wafer, so that the flow of said raw material gas is substantially parallel to the principal surface of each semiconductor wafer, and discharging exhausted raw material gas on the other side opposite to the gas supply side, at a position in the vicinity of each said semiconductor wafer, to grow thin layers on said semiconductor wafers from said raw material, said supplying a raw material gas including passing the raw material gas from an inner tube of a double-tube nozzle to said semiconductor wafers in a state that a separate gas flows through the outer tube of said double-tube nozzle in a direction opposite to a direction in which said raw material gas flows through said inner tube, to grow the thin layers on said semiconductor wafers, said inner tube having a multiplicity of holes or slits for supplying said raw material gas to said semiconductor wafers.

7. A method according to claim 6, wherein said semiconductor wafers are arranged in a heater which is disposed in said reaction vessel, an exhaust nozzle is disposed so that said semiconductor wafers are interposed between said double-tube nozzle and said exhaust nozzle, and said exhaust nozzle has a multiplicity of exhaust holes which are provided at positions corresponding to the gas supply holes of said double-tube nozzle, so that said raw material gas ejected from said gas supply holes flows on each semiconductor wafer in horizontal directions and is then sucked by said exhaust nozzle at said exhaust holes.

8. A method according to claim 6, wherein a small amount of hydrogen halide is added to said raw material gas, said small amount being sufficient to avoid deposition of semiconductor material on the nozzle but insufficient to prevent deposition of semiconductor material on the wafers.

9. A method of growing a thin layer on a semiconductor wafer from vapor phase, comprising the steps of:
holding a multiplicity of semiconductor wafers within a cylindrical heater in a state that said semiconductor wafers are arranged in a vertical direction at substantially regular intervals while making the principal surface of each semiconductor wafer substantially parallel to a horizontal plane and are rotated about an axis passing through the substantial center of the principal surface of each semiconductor wafer, said heater being able to substantially surround all the semiconductor wafers;
placing said heater in a reaction vessel to isolate said heater from the external atmosphere;
heating said heater by a heating source, said heating source being provided outside of said reaction vessel;
supplying a raw material gas from one side of said semiconductor wafers to each semiconductor wafer, at a position in the vicinity of each said semiconductor wafer, so that the flow of said raw material gas is substantially parallel to the principal surface of each semiconductor wafer, and discharging exhausted raw material gas on the other side opposite to the gas supply side, at a position in the vicinity of each said semiconductor wafer, to grow thin layers on said semiconductor wafers from said raw material; and
passing said wafers, after having said thin layers grown thereon, into a cooling chamber that is in direct communication with said reaction vessel via an isolating wall capable of opening and shutting off the direct communication, whereby the wafers can be transferred to the cooling chamber without being exposed to the atmosphere, the coated wafers being cooled in said cooling chamber.

* * * * *